(12) United States Patent
Funk et al.

(10) Patent No.: US 8,038,834 B2
(45) Date of Patent: Oct. 18, 2011

(54) METHOD AND SYSTEM FOR CONTROLLING RADICAL DISTRIBUTION

(75) Inventors: Merritt Funk, Austin, TX (US); David V. Horak, Essex Junction, VT (US); Eric J. Strang, Chandler, AZ (US); Lee Chen, Cedar Creek, TX (US)

(73) Assignees: Tokyo Electron Limited, Tokyo (JP); International Business Machines Corporation ("IBM"), Armonk, NY (US)

( * ) Notice: Subject to any disclaimer, the term of this patent is extended or adjusted under 35 U.S.C. 154(b) by 0 days.

(21) Appl. No.: 12/754,662

(22) Filed: Apr. 6, 2010

(65) Prior Publication Data
US 2010/0193471 A1   Aug. 5, 2010

Related U.S. Application Data

(63) Continuation of application No. 11/233,025, filed on Sep. 23, 2005, now Pat. No. 7,718,030.

(51) Int. Cl.
*H01L 21/3065* (2006.01)
*C23C 16/00* (2006.01)
*C23C 16/455* (2006.01)
*C23C 16/50* (2006.01)

(52) U.S. Cl. ............... 156/345.29; 118/715; 216/67; 427/569; 438/710; 438/771; 438/776; 134/1.1

(58) Field of Classification Search ................ 118/715; 156/345.29, 345.33, 345.34; 216/67; 427/569; 438/710, 771, 776; 134/1.1
See application file for complete search history.

(56) References Cited

U.S. PATENT DOCUMENTS

| | | | |
|---|---|---|---|
| 5,962,085 A | 10/1999 | Hayashi et al. | 427/585 |
| 6,334,983 B1 | 1/2002 | Okayama et al. | 422/186.29 |
| 6,403,491 B1 | 6/2002 | Liu et al. | 438/710 |
| 6,432,259 B1 | 8/2002 | Noorbakhsh et al. | 156/345.33 |
| 6,537,418 B1 | 3/2003 | Muller et al. | 156/345.34 |
| 6,733,620 B1 | 5/2004 | Sugiyama et al. | 156/345.29 |
| 6,821,910 B2 | 11/2004 | Adomaitis et al. | 438/758 |
| 7,273,526 B2 | 9/2007 | Shinriki et al. | 118/715 |
| 7,718,030 B2 * | 5/2010 | Funk et al. | 156/345.29 |
| 2004/0216668 A1 | 11/2004 | Lindfors et al. | 118/715 |
| 2005/0103265 A1 | 5/2005 | Gianoulakis et al. | 118/715 |
| 2005/0109460 A1 | 5/2005 | DeDontney et al. | 156/345.33 |
| 2005/0208217 A1 | 9/2005 | Shinriki et al. | 427/248.1 |
| 2005/0229848 A1 | 10/2005 | Shinriki et al. | 118/715 |
| 2005/0255257 A1 | 11/2005 | Choi et al. | 118/715 |
| 2006/0054280 A1 | 3/2006 | Jang | 156/345.34 |
| 2006/0234514 A1 | 10/2006 | Gianoulakis et al. | 438/758 |
| 2007/0026540 A1 | 2/2007 | Nooten et al. | 438/5 |
| 2007/0068625 A1 | 3/2007 | Funk et al. | 156/345.29 |
| 2010/0193471 A1 * | 8/2010 | Funk et al. | 216/67 |

FOREIGN PATENT DOCUMENTS

JP   2000-188281   7/2000

* cited by examiner

*Primary Examiner* — Jeffrie R Lund
(74) *Attorney, Agent, or Firm* — Oblon, Spivak, McClelland, Maier & Neustadt, L.L.P.

(57) ABSTRACT

A plasma processing system includes a processing chamber, a substrate holder configured to hold a substrate for plasma processing, and a gas injection assembly. The gas injection assembly includes a first evacuation port located substantially in a center of the gas injection assembly and configured to evacuate gases from a central region of the substrate, and a gas injection system configured to inject gases in the process chamber. The plasma processing system also includes a second evacuation port configured to evacuate gases from a peripheral region surrounding the central region of the substrate.

15 Claims, 13 Drawing Sheets

METHOD AND SYSTEM FOR CONTROLLING RADICAL DISTRIBUTION

CROSS-REFERENCE TO RELATED CASE

This application is a continuation of and claims the benefit of priority from U.S. application Ser. No. 11/233,025, filed Sep. 23, 2005, the entire contents of which are incorporated herein by reference.

BACKGROUND OF THE INVENTION

1. Field of the Invention

The present invention relates to the field of materials processing equipment, and more particularly to vacuum processing systems for processing a substrate.

2. Discussion of the Background

Plasma processing systems are used in the manufacture and processing of semiconductors, integrated circuits, displays, and other devices or materials to both remove material from or to deposit material on a substrate, such as a semiconductor substrate. In such processes, plasma can be employed to create and assist surface chemistry within such a plasma processing system. It has become standard practice in the semiconductor industry to use plasma processing of semiconductor substrates to perform plasma assisted pattern etching, whereby a pattern for an integrated circuit that is formed in a photolithographic mask is transferred to the substrate, or to perform plasma enhanced vapor deposition, whereby dielectric or conductive films are deposited on the substrate.

In general, plasma is formed with the plasma processing system under vacuum conditions by heating electrons to energies sufficient to sustain ionizing collisions with a supplied process gas. The process gas is introduced via a gas inject plate or a showerhead into the plasma processing chamber, and the process gas is subsequently heated through collisions with energetic electrons in the presence of an electrical field created between an upper electrode assembly and a substrate. The heated electrons can have energy sufficient to sustain dissociative collisions, or sustain ionization collisions. Therefore, a specific set of process gases under predetermined conditions (such conditions include, for example, the chamber pressure, gas flow rate, power, etc.) are chosen to produce a population of charged species and chemically reactive species suitable to the particular process being preformed within the chamber. Such processes can be for example the etching processes where materials are removed from the substrate, or deposition processes where materials are added to the substrate.

It is well known that process uniformity across the substrate surface is important to providing homogeneous device characteristics across the substrate surface and improved manufacturing yields per substrate. For example, a gas injection showerhead is typically implemented in an attempt to provide a uniform distribution of process gas across the substrate surface, thereby improving process uniformity. Despite these efforts, however, process uniformity still remains a problem in processing semiconductor substrates.

SUMMARY OF THE INVENTION

Accordingly, an object of the present invention is to address the above and/or other problems in the art related to substrate processing.

Another object of the present invention is to control the radial distribution of a process parameter in the processing region in order to control the uniformity of treatment to the substrate.

Still another object of the invention is to improve process uniformity across a substrate surface during plasma processing of a substrate.

These and/or other objects of the present invention may be achieved by a plasma processing system. In one aspect of the invention, the system includes a processing chamber, a substrate holder configured to hold a substrate for plasma processing, and a gas injection assembly. The gas injection assembly includes a first evacuation port located substantially in a center of the gas injection assembly and configured to evacuate gases from a central region of the substrate, and a gas injection system configured to inject gases in the process chamber. The plasma processing system also includes a second evacuation port configured to evacuate gases from a peripheral region surrounding the central region of the substrate.

In another aspect of the invention, the plasma processing system includes a processing chamber configured to contain a plasma therein, a substrate holder configured to hold a substrate for plasma processing, and means for injecting process gas into the processing chamber. Also included in means for evacuating a central region of the processing chamber, and means for evacuating a peripheral region of the processing chamber.

In yet another aspect of the invention, a method of controlling the pressure in a plasma processing chamber includes evacuating the gases from a peripheral region of a processing region proximate to a substrate being processed in the plasma processing chamber, and evacuating the gases substantially from a center of the processing region through an evacuation port in a gas injection assembly located above the substrate. The evacuating of the gases is controlled using at least one of a pump or a valve.

BRIEF DESCRIPTION OF THE DRAWINGS

Other characteristics and advantages of the invention will become apparent from the following detailed description, particularly when considered in conjunction with the drawings in which.

DESCRIPTION OF THE PREFERRED EMBODIMENTS

As discussed in the Background section above, although gas injection assemblies have been used to achieve improved gas distribution uniformity across a substrate being processed, non-uniformity of the process itself can still be observed across the substrate surface. This is particularly true in large substrate processing systems that process 200 mm and 300 mm substrates, for example. The present inventors have studied conventional processing systems in an effort to determine factors contributing to process non-uniformity, and possible ways to improve process uniformity.

Figure 1:
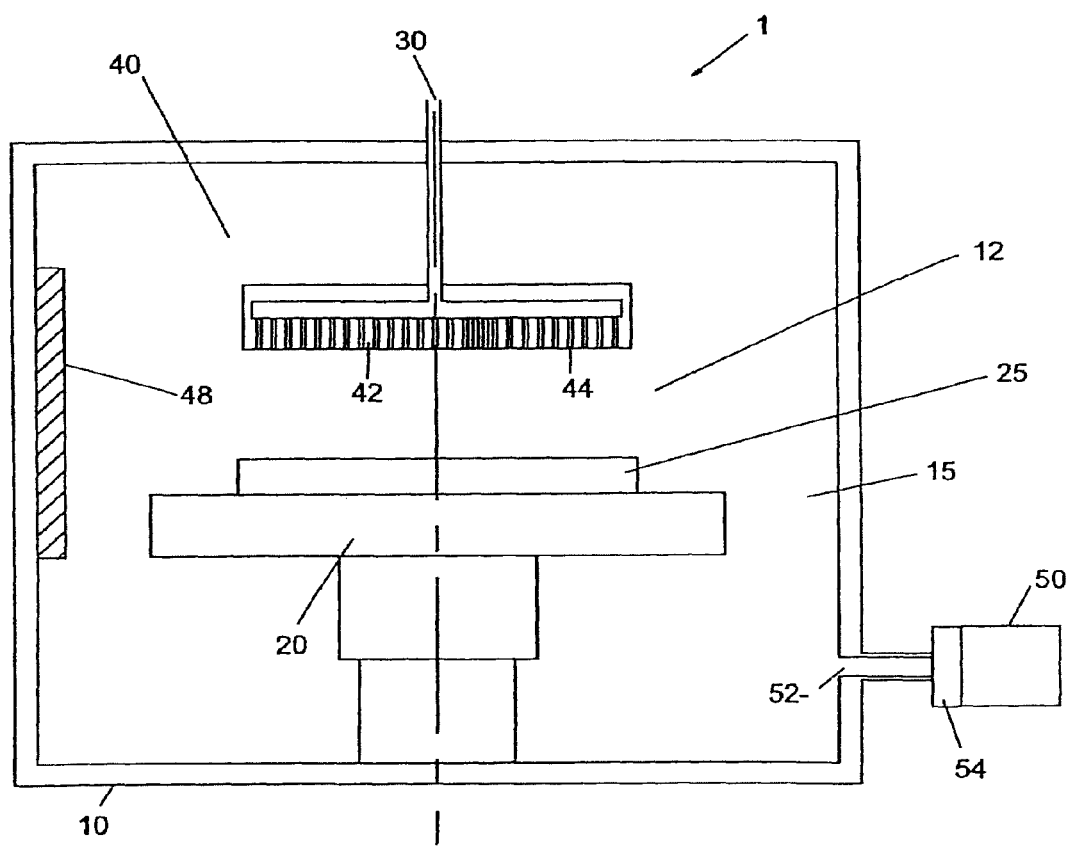
FIG. 1 shows a conventional plasma processing system.

FIG. 1 shows an exemplary cross-sectional representation of a conventional processing system 1 that utilizes plasma to treat a substrate 25. The processing system 1 comprises a plasma processing chamber 10 configured to provide a clean, vacuum environment for treating substrate 25 and to facilitate the formation of plasma therein. The plasma processing chamber 10 includes a gas injection assembly 40 including a process gas supply port 30 coupled to the gas injection assembly 40. As shown in FIG. 1, the gas injection assembly 40 includes an inject plate 42 having a plurality of gas injection orifices 44 to introduce and distribute process gases in the processing region 12. A gas injection plate having a plurality of gas injection orifices may be referred to as a "showerhead" inject plate. Process gases are evacuated from the plasma processing chamber 10 by a vacuum pump 50 through an exhaust duct 52 and vacuum valve 54. The vacuum valve 54 may be opened or closed in order to adjust or control the pressure in plasma processing chamber 10.

In addition to injecting process gases, the gas injection assembly 40 can serve as an upper electrode in the plasma processing chamber 10, and can be coupled to a radio frequency (RF) power source (not shown) operating at frequencies between 10 MHz and several 100 MHz, for example. In the system of FIG. 1, the lower electrode includes a substrate holder 20, and substrate 25 supported thereon. The plasma processing chamber 10 (excluding the gas injection assembly 40 if it serves as an electrically biased upper electrode) can be coupled to electrical ground. The lower electrode, or substrate holder 20, may be coupled to electrical ground, or it may be electrically biased using, for example, RF power.

By coupling RF power to the upper electrode (the gas injection assembly 40 in FIG. 1), and grounding or electrically biasing the lower electrode (the substrate holder 20 and substrate 25 in FIG. 1), an electrical field is generated in the processing region 12. The electrical field causes gases in the processing region 12 to form a plasma. The plasma includes ionized gases, as well as chemically reactive radicals that can perform processing, such as etching or deposition, of the substrate 25. For example, a particular mixture of gases can provide selective etching of a dielectric layer, such as silicon dioxide ($SiO_2$), on a substrate, while other layers consisting of other materials are etched at a slower rate. The side walls of the plasma processing chamber are protected from the process gasses by deposition shield 48.

The present inventors have recognized that in the conventional plasma processing chamber 10, the gases introduced by the gas injection assembly 40 create a stagnation flow over substrate 25, and typically flow across a surface of the substrate 25. For example, the process gases may flow radially outwards from a central portion of the processing region 12 into a peripheral area 15 of the plasma processing chamber 10, and are subsequently evacuated through the evacuation port 52 mounted in the side wall of the plasma processing chamber 10. The present inventors have discovered that this flow of processing gases across the substrate surface can cause non-uniform processing of the substrate 25.

When performing an etching process on substrate 25, the distribution of plasma and chemically reactive radicals above substrate 25 can be affected by the nature of the flow of plasma and radicals and other gaseous constituents over the surface of the substrate. The flow of plasma, radicals and other gaseous constituents can be influenced by the gas injection assembly 40 and, further, this flow can be influenced by the vacuum pumping system and how it accesses the plasma processing chamber 10. For example, in the former, the radial outflow of reactants, as in a stagnation flow, can lead to changes in the process chemistry from the center of substrate 25 to the periphery of substrate 25. For example, these changes may be caused by the consumption of process chemistry by the etching process, recombination of some radicals, or even further dissociation of some radicals. The process chemistry exposed to the peripheral edge of substrate 25 has resided for a longer period of time in the plasma processing chamber, thus, giving it more time to evolve due to its interaction with plasma. The present inventors have further recognized that the process non-uniformities caused by the flow of process gases cannot be easily compensated for by adjustment of other process parameters, such as temperature, pressure, or flow rates, because such adjustments may affect other profile attributes of the process.

Figure 2A:
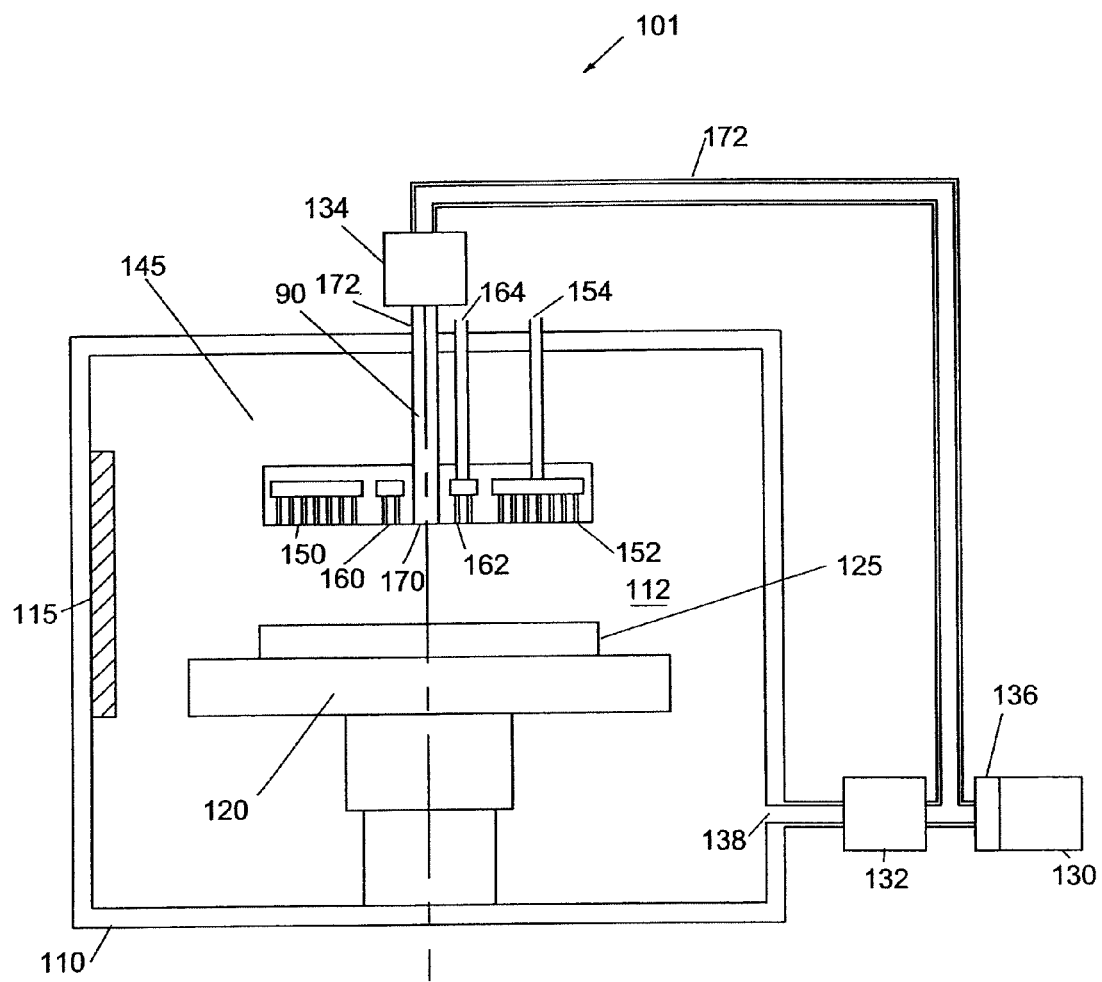
FIG. 2A is a cross sectional representation of a plasma processing system in accordance with an embodiment of the invention.

FIG. 2A shows a plasma processing system 101 for providing improved process uniformity in accordance with an embodiment of the present invention. As with the conventional system of FIG. 1, the processing chamber 110 of FIG. 2A includes a substrate holder 120 configured to support a substrate 125, a vacuum pump 130 configured to evacuate the plasma processing chamber 110 through an exhaust duct 138, a gas injection assembly 145 configured to introduce process gases to processing region 112, and a deposition shield 115 configured to protect internal surfaces of the plasma processing chamber 110. The gas injection assembly 145 and the substrate holder 120 are typically substantially circular in shape, and are arranged centered in the same vertical axis in the middle of the plasma processing chamber 110, but gas injection assemblies and substrate holders with different shapes are also within the scope of the present invention. For example, gas injection assembly 145 can have a rectangular shape, an ovular shape, or circular-symmetric shapes such as a hexagon, pentagon or other polygon. The circular symmetry is used to process substrates such as semiconductor wafers, which are usually of circular shape.

As seen in FIG. 2A, the gas injection assembly 145 includes a plurality of gas injection zones, such as a peripheral gas injection zone 150 and a central gas injection zone 160, each including multiple gas injection holes 152, 162. Specifically, a peripheral gas supply port 154 provides process gas to the peripheral gas injection zone 150, and gas injection holes 152 within the peripheral gas injection zone 150 distribute the process gas to a peripheral area of the processing region 112. Similarly, a central gas supply port 164 provides process gas to the central gas injection zone 160, and gas injection holes 162 within the central gas injection zone 160 distribute the process gas to a central area of the processing region 112. The process gases supplied to the zones 150 and 160 may be the same or different gases, and may be supplied at the same or different flow rates in order to provide control of process gas distribution in the processing region 112.

The gas injection assembly 145 also includes a gas evacuation port 170 coupled to vacuum pump 130 through an exhaust line 172. In one embodiment, the vacuum pump 130 evacuates the processing region 112 proximate a central area of substrate 125 through the gas evacuation port 170, and evacuates the processing region 112 proximate a peripheral area of substrate 125 through the exhaust duct 138. A gate valve 136 may be utilized to fully close, fully open, or partially open vacuum pump 130 to exhaust duct 138 and evacuation port 170. Additionally, a first vacuum valve 132 located between exhaust duct 138 and vacuum pump 130 can be used to adjust the pumping speed delivered to the peripheral area of processing region 112, and a second vacuum valve 134 can be used to adjust the pumping speed delivered to the central area of processing region 112. For example, the first and second vacuum valves 132, 134 can include butterfly valves.

Figure 2B:
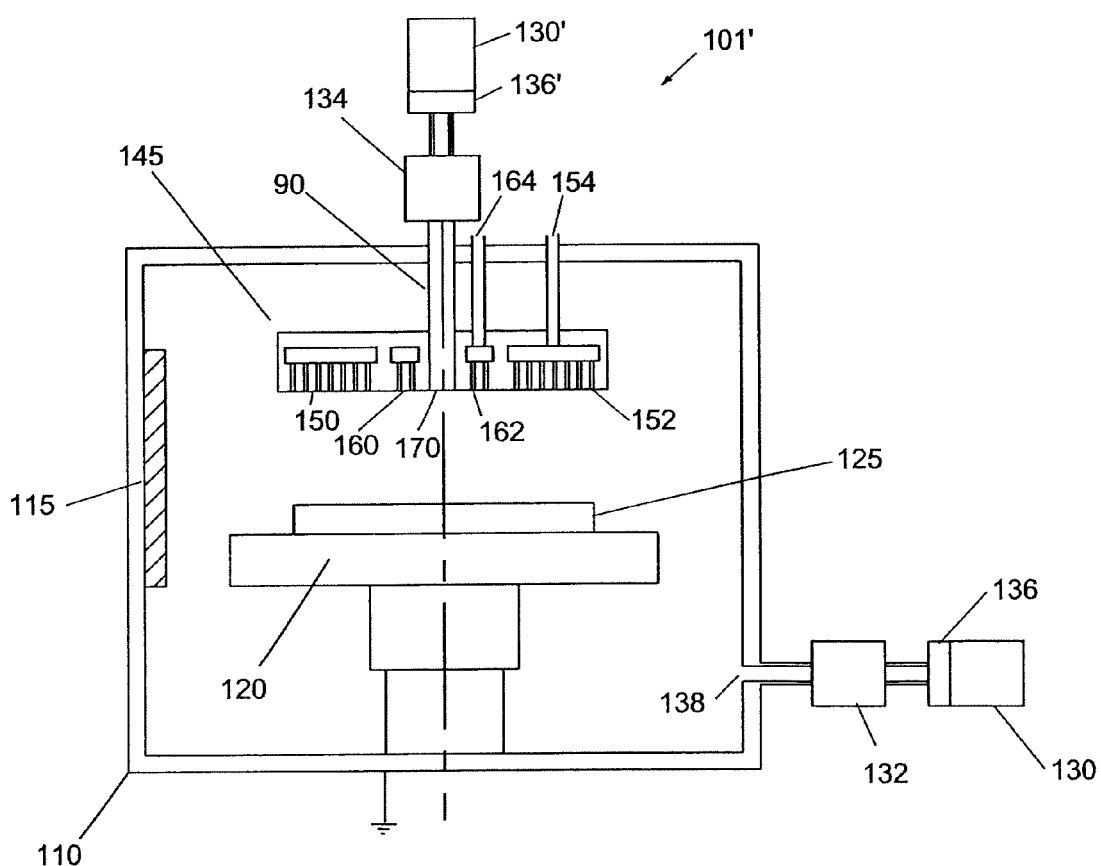
FIG. 2B is a cross sectional representation of a plasma processing system in accordance with another embodiment of the invention.

In an alternate embodiment shown in FIG. 2B, the gas injection assembly 145 includes gas evacuation port 170 coupled to a second vacuum pump 130' through a second gate valve 136'. The second gate valve 136' may be utilized to fully close, fully open, or partially open the second vacuum pump 130 to evacuation port 170. In this embodiment, the first gate valve 132 and the second vacuum valve 134 may be optional.

The vacuum pump 130 or 130' can be characterized as a turbo-molecular vacuum pump (TMP) capable of a pumping speed up to 5000 liters per second (and greater). As described above, a gate valve may be utilized for throttling the chamber pressure with or without the vacuum valve. In conventional plasma processing devices utilized for dry plasma etch, a 1000 to 3000 liter per second TMP is generally employed. TMPs are useful for low pressure processing, typically less than 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 110. The pressure measuring device can be, for example, a Type 628B Baratron absolute capacitance manometer commercially available from MKS Instruments, Inc. (Andover, Mass.).

Figure 3:
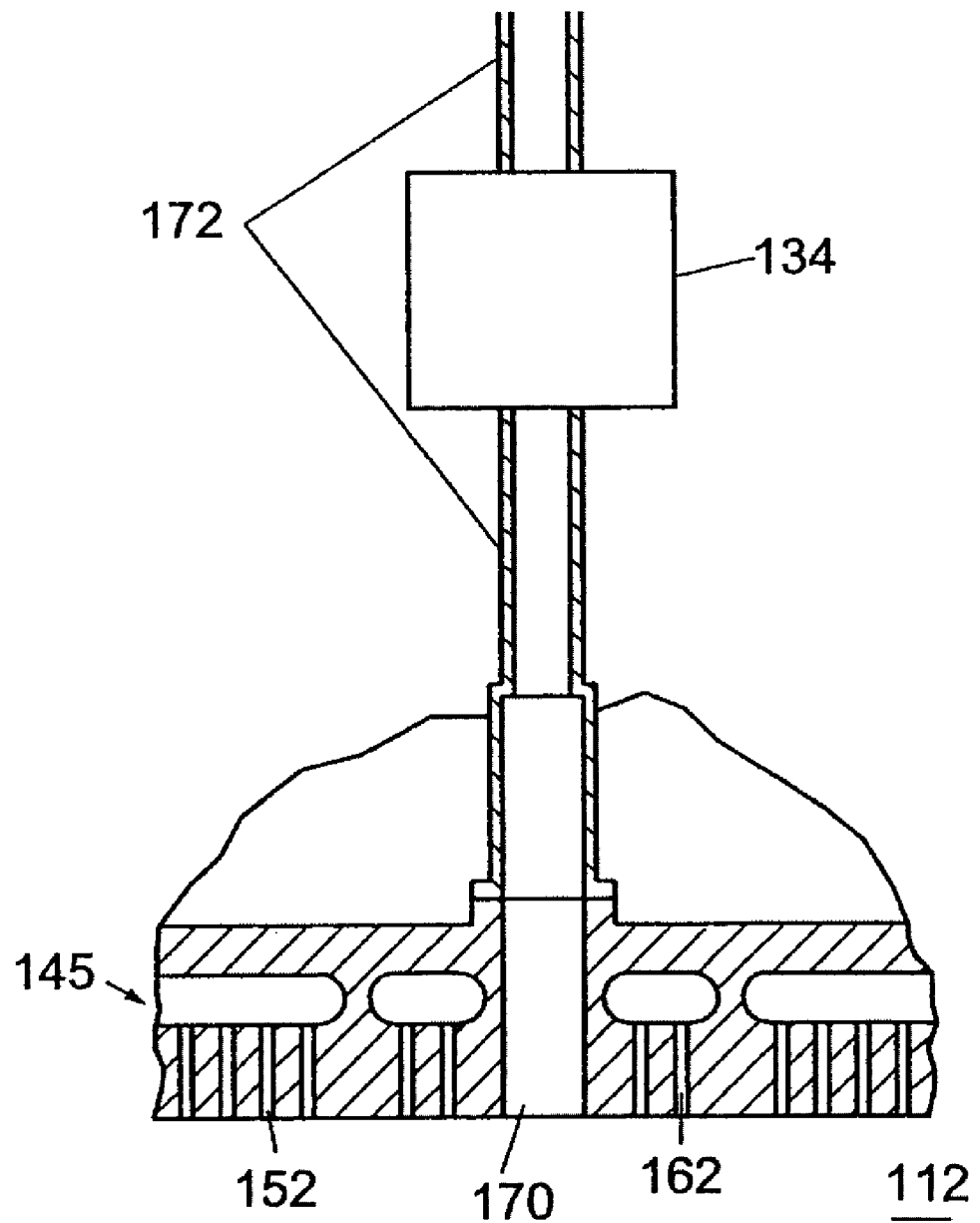
FIG. 3 is a central cross sectional view of details of the gas injection evacuation port shown in FIGS. 2A and 2B.

FIG. 3 shows a more detailed cross-sectional view of the gas injection assembly 145 of FIGS. 2A and 2B. As seen in this figure, the evacuation port 170 is implemented as a straight through hole positioned substantially in a center of the gas injection assembly 145 and substantially perpendicular to a lower planar surface of the gas injection assembly 145. While not shown in FIG. 3, the opening of the evacuation port 170 facing the processing region 112 may have a rounded or tapered edge to facilitate low resistance flow of process gases through evacuation port 170.

Figure 4:
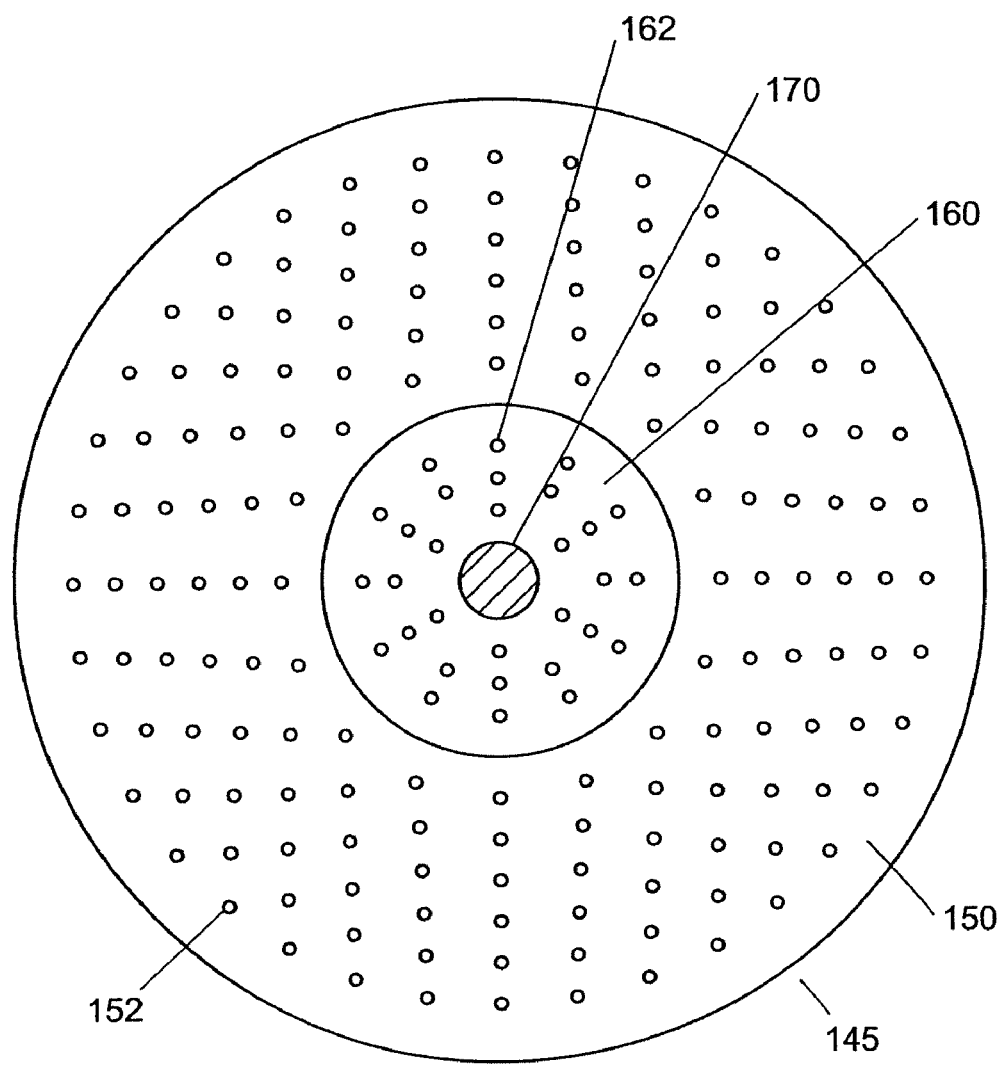
FIG. 4 is a bottom view of the showerhead shown in FIGS. 2A and 2B.

FIG. 4 shows a bottom view of the gas injection assembly 145 of FIG. 1. As seen in this figure, the evacuation port 170 is substantially circular and substantially centered on the gas injection assembly 145, with the central gas injection zone 160 surrounding the evacuation port 170. Further, the peripheral gas injection zone 150 surrounds the central gas injection zone 60. Thus, in the embodiment of FIG. 4, the gas injection assembly 145 is substantially circular with the gas injection zones 150 and 160 substantially concentric about the evacuation port 170. It is to be understood, however, that other shapes and configurations of the gas injection assembly 145 may be used. The evacuation port 170 preferably has a diameter of between 1 cm and 15 cm, more preferably between 2 cm and 10 cm. Moreover, as seen in FIG. 4, the gas injection holes 152 and 162 are substantially evenly distributed within gas injection zones 150 and 160 of the gas injection assembly 145; however, other distributions can be used. For example, the gas injection holes 152, 162 may be organized in a rectilinear pattern, or a circular pattern. The number of gas injection holes 162 in the central gas injection zone 160 can be the same as the number of gas injection holes 152 in the peripheral gas injection zone 150. Alternatively, the number of gas injection holes 162 in the central gas injection zone 160 can be different than the number of gas injection holes 152 in the peripheral gas injection zone 150. For example, the number of gas injection holes 162 in the central gas injection zone 160 can be less than the number of gas injection holes 152 in the peripheral gas injection zone 150. Additionally, the number density of gas injection holes 162 in the central gas injection zone 160 can be different than the number of gas injection holes 152 in the peripheral gas injection zone 150, or they may be the same. Furthermore, the size of gas injection holes 162 in the central gas injection zone 160 can be different than the number of gas injection holes 152 in the peripheral gas injection zone 150, or they may be the same.

Figures 5A, 5B:
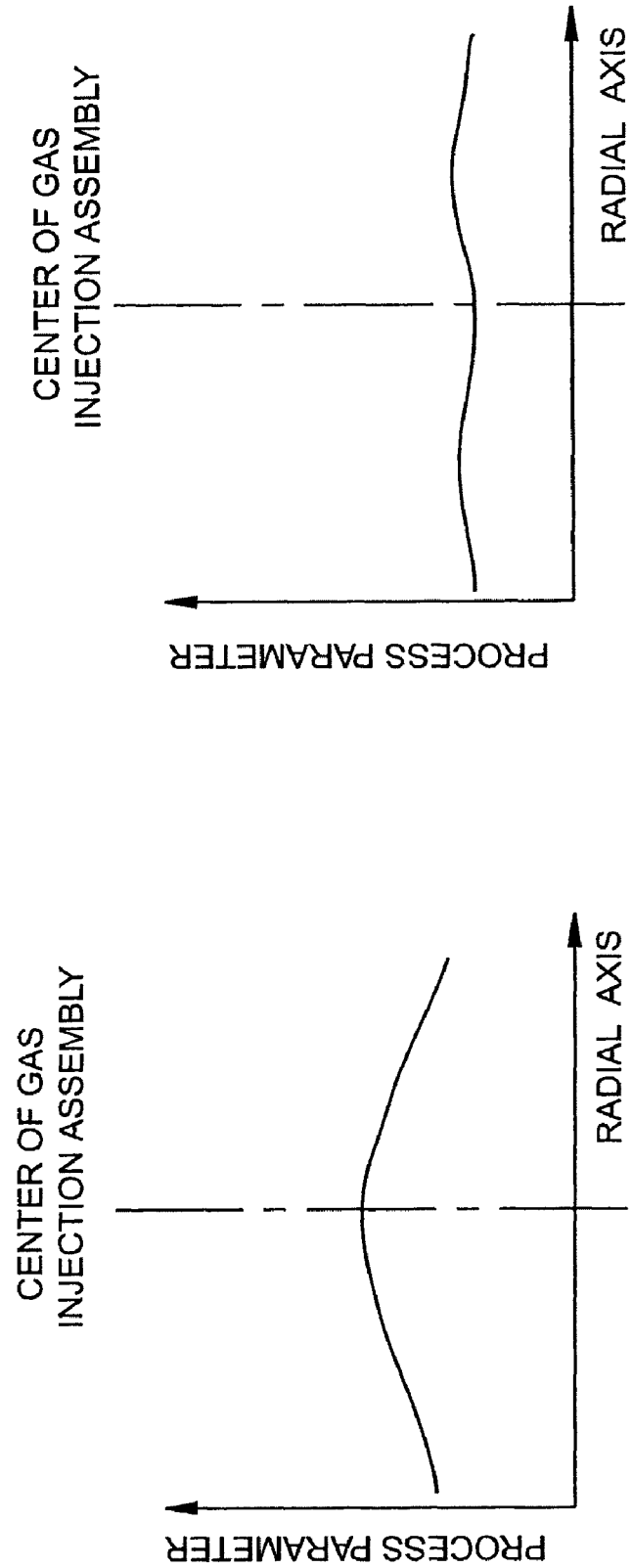
FIGS. 5A-5B are pressure profile graphs showing radial pressure distribution of the process gases in a processing region of a plasma processing chamber.

Thus, in the embodiment of FIGS. 1-4, the plasma processing chamber 110 includes evacuation from a peripheral area of processing region 112, as well as evacuation from a central region of processing region 112 through an evacuation port 170 substantially within concentric gas injection zones of the gas injection assembly 145. The present inventors have discovered that this use of an inner and outer evacuation region provides for more uniform processing of the substrate than can be accomplished by the conventional processing system of FIG. 1. Specifically, FIG. 5A shows the radial profile of a process parameter, such as gas pressure, above the substrate in a conventional plasma processing chamber wherein the gas flows substantially radially outwards across the substrate as discussed above. As seen in FIG. 5A, the distribution profile across the diameter of the substrate is such that the process parameter is at a peak value in the center of the processing region, and continuously decreases towards the edges of the substrate where the gases are evacuated. Additionally, other properties of the process chemistry can exhibit radial non-uniformities. The process parameter can, for example, include temperature, pressure, chemical concentration, velocity, etc. Such an uneven profile of a process parameter, such as pressure, is disadvantageous for homogenous etch or deposition processes to be performed on the substrate.

FIG. 5B shows a radial profile of a process parameter, such as gas pressure, above the substrate that can be achieved in a plasma processing chamber having a capability to evacuate exhaust gases from a peripheral area of the processing region and a central area of the processing region. As seen in this figure, the capability for evacuating exhaust gases from the central area of the processing region, in addition to the peripheral area, provides greater control of the profile of process parameters such that a more uniform treatment of the substrate surface can be achieved.

Figure 6:
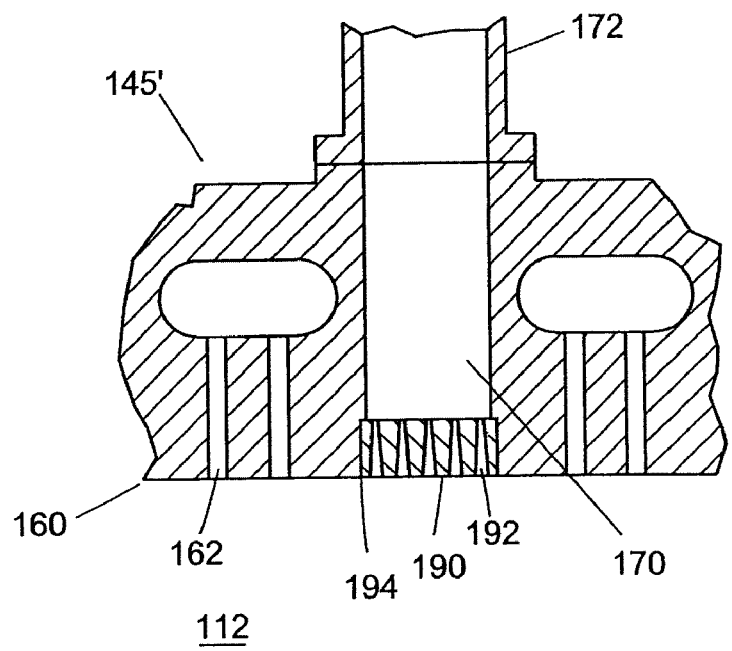
FIG. 6 is a central cross-sectional view of a gas injection system having a baffle plate in accordance with an embodiment of the invention.

FIG. 6 shows a cross section of the central portion of a gas injection assembly in accordance with another embodiment of the invention. As seen in this figure, the gas evacuation port 170 in the gas injection assembly 145' can further comprise a baffle plate 190. The baffle plate 190 can optionally be placed within the evacuation port 170. The baffle plate 190 can be used to prevent the penetration of plasma into exhaust line 172. The presence of plasma in exhaust line 172 can cause damage to vacuum parts including vacuum pumps, vacuum valves, gate valves, etc. In this regard, the baffle plate 190 includes a plurality of high aspect ratio openings 192 that impede the plasma flow from the processing region 112 to the exhaust line 172 through evacuation port 170.

The plurality of openings can include a plurality of slots. The slots can be aligned in an azimuthal direction. Alternatively, the slots can be aligned in a radial direction. Alternatively, the slots can be slanted and, therefore, aligned partially in a radial direction and an azimuthal direction. The plurality of openings can comprise a combination of alignment methodologies thereof. Alternately, the plurality of openings can include at least one orifice.

In one embodiment, the baffle plate 190 includes between 2 and approximately 1000 openings, and more desirably between approximately 10 and 200 openings. The diameter of each opening 192 in the baffle plate 190 can range between approximately 0.1 mm and 20 mm, and more desirably between approximately 0.5 mm and 2 mm. The length of each opening 192 in the baffle plate 190 can range between approximately 0.1 mm and 20 mm, and more desirably between approximately 0.5 mm and 2 mm. For example, the aspect ratio (ratio of the length of each opening to the diameter of each opening) can range from approximately a value of 1 to approximately 200. In the embodiment shown in FIG. 6, the baffle plate 190 can be retained within a recess 194 formed at an opening of the evacuation port 170. The baffle plate 190 can be removably coupled to recess 194, or it can be fixedly coupled to recess 194. For example, the baffle plate may be affixed to recess 194 using a plurality of fasteners, such as bolts, or it may be press-fit, bonded or welded to the recess 194. In the former example, the baffle plate 190 may be removably coupled and sealably coupled to recess 194 using a sealing device 182 (shown in FIG. 7), such as an elastomer O-ring.

Figure 7:
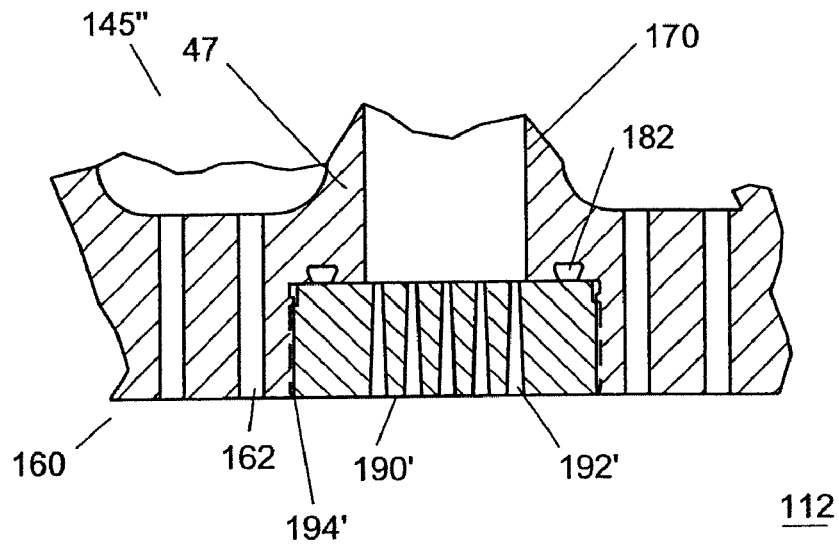
FIG. 7 is a central cross-sectional view of a gas injection system having a baffle plate in accordance with another embodiment of the invention.

Referring now to FIG. 7, one or more openings of a plurality of openings 192' formed in baffle plate 190' (for gas injection assembly 145') can be tapered. For example, the angle of inclination for a tapered surface in an opening can range from approximately 0 (straight-walled opening) to approximately 45 degrees. Desirably, the angle ranges from approximately 0 to 30 degrees; and desirably, the angle ranges from approximately 0 to approximately 10 degrees. As also seen in FIG. 7, the baffle plate 190' may be threaded to screw into a threaded recess 194'.

In yet another embodiment, the baffle plate may comprise a screen. The screen can, for example, include a plurality of openings, wherein each opening has a dimension less than or equal to approximately the mean free path between collisions within the gas being evacuated.

Figure 8:
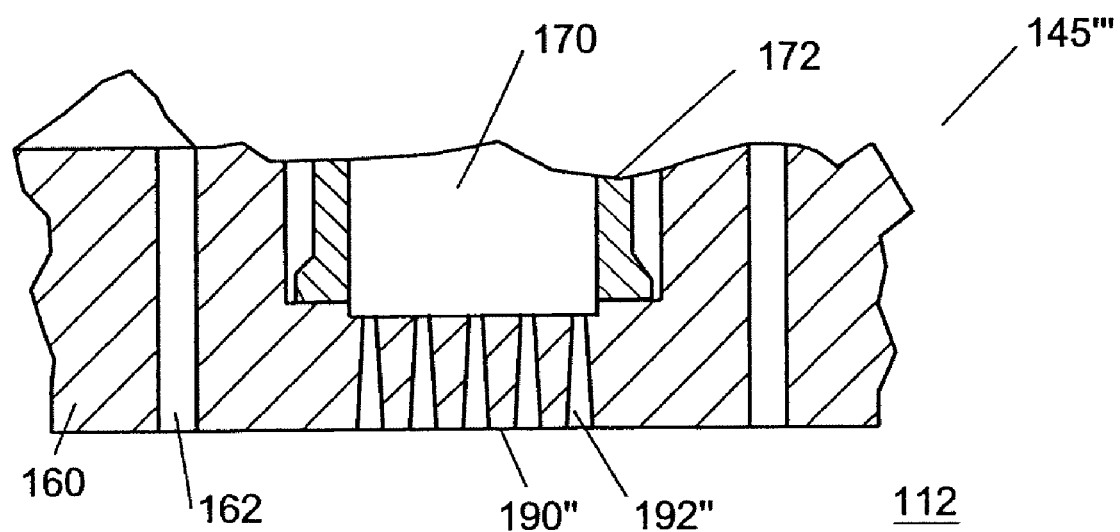
FIG. 8 is a central cross-sectional view of a gas injection system having a baffle plate in accordance with still another embodiment of the invention.

Referring now to FIG. 8, a cross section of a central portion of a gas injection assembly 145''' is presented, wherein a baffle plate 190'' having a plurality of openings 192'' is integrally formed within the gas injection assembly 145'''. For example, the baffle plate 190'' can be formed within an inject plate (having a plurality of gas injection holes for the central gas injection region and a peripheral gas injection region) that is coupled to gas injection assembly 145'.

Figure 9B:
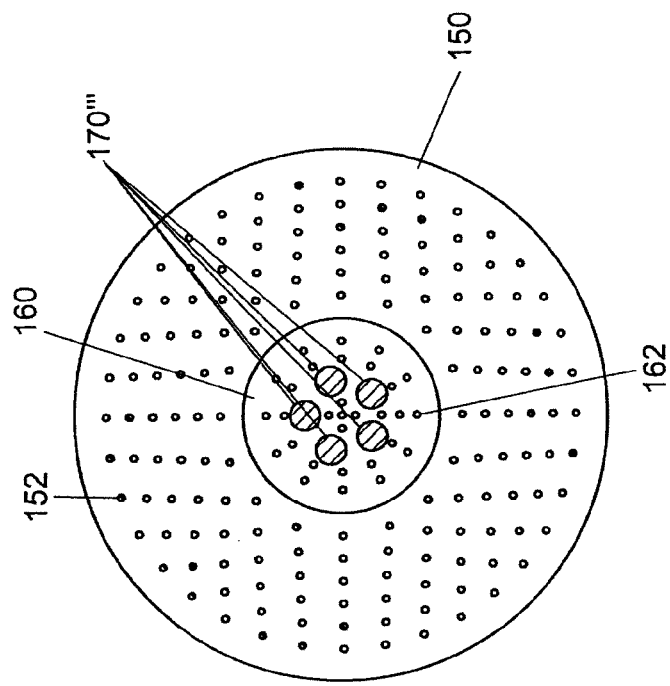
FIGS. 9A and 9B are bottom views of a gas injection system having multiple evacuation ports in accordance with alternate embodiments of the invention.
Figure 9A:
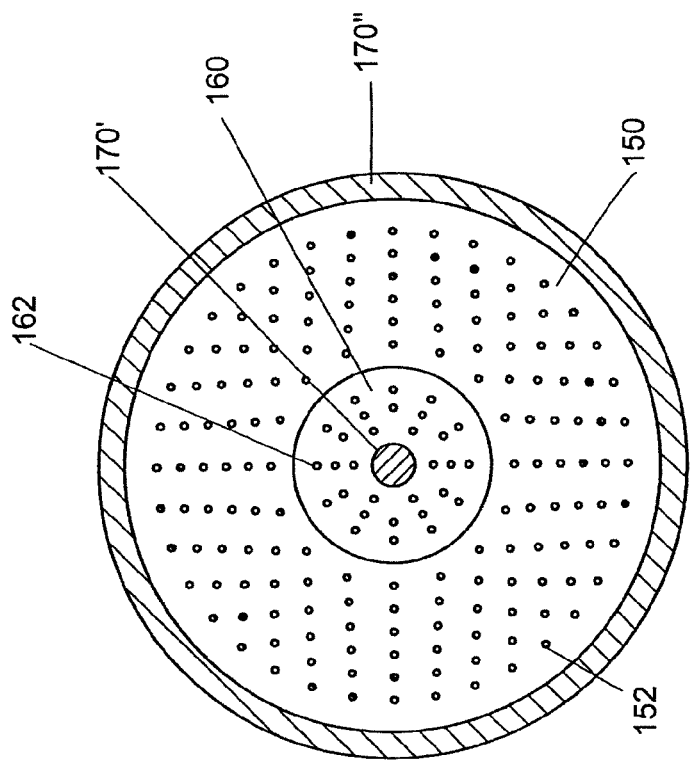

While the embodiments of FIGS. 2A and 2B show the gas injection assembly having a single evacuation port 170, the gas injection assembly may include a plurality of evacuation ports. FIGS. 9A and 9B provide bottom views showing gas injection assemblies having a plurality of evacuation ports in accordance with the present invention. As seen in FIG. 9A, the showerhead may include a central evacuation port 170' and a peripheral evacuation port 170'' positioned along an outer periphery of the peripheral gas injection zone 150. The peripheral evacuation port 170'' may provide the peripheral evacuation for equalizing pressure across the substrate without the need for a conventional evacuation port. However, the showerhead of FIG. 9A can also be used along with the conventional evacuation port for more rapid evacuation of the processing chamber.

In FIG. 9B the gas evacuation port is realized as multiple ports 170''' arranged around the central portion of the gas injection assembly, for example as a series of openings arranged circularly around the center of the gas injection assembly. It is within the scope of the invention that all of the ports 170''' are equipped with a separate vacuum pump for separate gas evacuation and control of the gas evacuation rate for each of these openings, but it is also possible that the multiple ports 170''' are coupled to a manifold directing all exhaust gases to one vacuum pump.

While not shown in the figures, it is also in the scope of the present invention to include gas injection assemblies with more than two zones of gas injection, such as multiple concentrically arranged gas injection zones or other arrangements of multiple-zone gas injection arrangements in the gas injection assembly.

Figure 10:
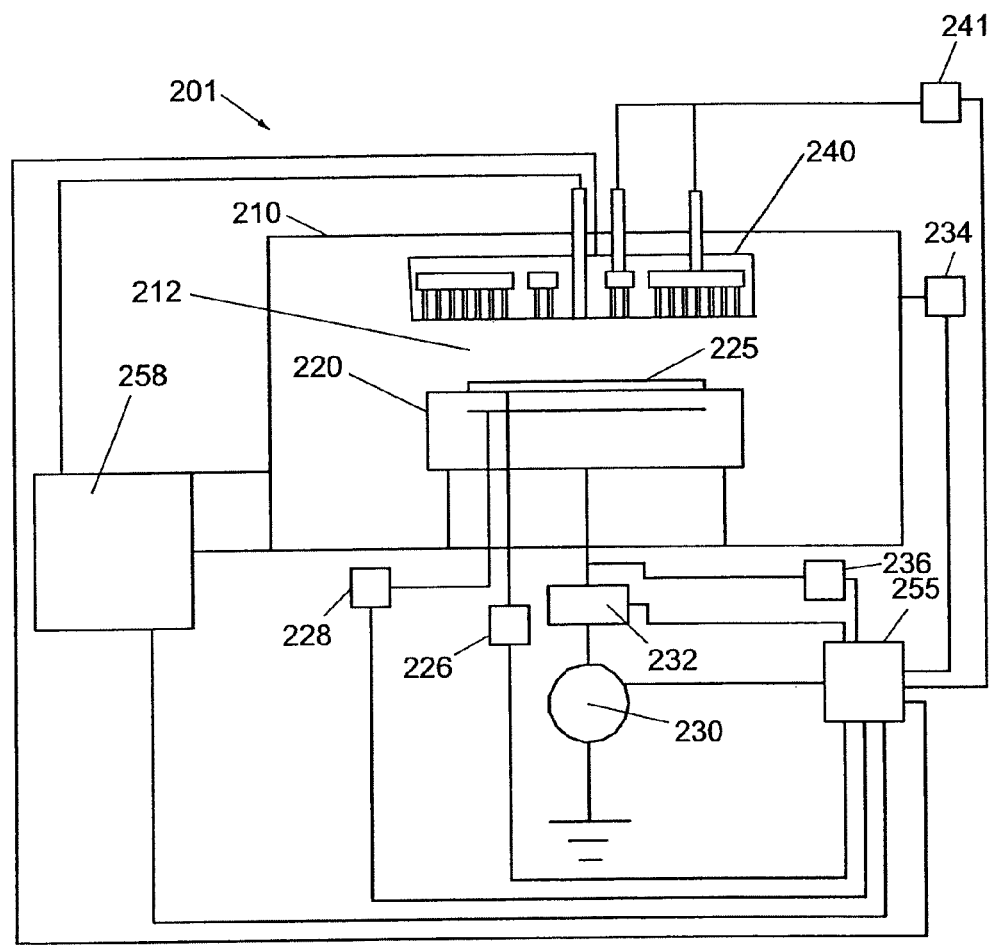
FIG. 10 is a schematic representation of a material processing system in accordance with an embodiment of the present invention.

FIG. 10 is a schematic representation of a material processing system in accordance with an embodiment of the present invention. The material processing system 201 includes process tool 210, substrate holder 220, upon which a substrate 225 to be processed is affixed, gas injection system 240, and vacuum pumping system 258. Substrate 225 can be, for example, a semiconductor substrate, a wafer, or a liquid crystal display (LCD). The gas injection system 240 may be any of the gas injection systems described with respect to FIGS. 2-9. Process tool 210 can be, for example, configured to facilitate the generation of plasma in processing region 212 adjacent a surface of substrate 225, where plasma is formed via collisions between heated electrons and an ionizable gas. An ionizable gas or mixture of gases is introduced via gas injection system 240, and the process pressure is adjusted. Desirably, plasma is utilized to create materials specific to a predetermined materials process, and to aid either the deposition of material to substrate 225 or the removal of material from the exposed surfaces of substrate 225. For example, controller 255 can be used to control vacuum pumping system 258 and gas injection system 240.

Substrate 225 can be, for example, transferred into and out of process tool 10 through a slot valve (not shown) and chamber feed-through (not shown) via robotic substrate transfer system where it is received by substrate lift pins (not shown) housed within substrate holder 220 and mechanically translated by devices housed therein. Once substrate 225 is received from substrate transfer system, it is lowered to an upper surface of substrate holder 220.

For example, substrate 225 can be affixed to the substrate holder 220 via an electrostatic clamping system 228. Furthermore, substrate holder 220 can further include a cooling system including a re-circulating coolant flow that receives heat from substrate holder 220 and transfers heat to a heat exchanger system (not shown), or when heating, transfers heat from the heat exchanger system. Moreover, gas can be delivered to the back-side of the substrate via a backside gas system 226 to improve the gas-gap thermal conductance between substrate 225 and substrate holder 220. Such a system can be utilized when temperature control of the substrate is required at elevated or reduced temperatures. For example, temperature control of the substrate can be useful at temperatures in excess of the steady-state temperature achieved due to a balance of the heat flux delivered to the substrate 225 from the plasma and the heat flux removed from substrate 225 by conduction to the substrate holder 220. In other embodiments, heating elements, such as resistive heating elements, or thermo-electric heaters/coolers can be included.

As shown in FIG. 10, substrate holder 220 includes an electrode through which RF power is coupled to plasma in processing region 212. For example, substrate holder 220 can be electrically biased at an RF voltage via the transmission of RF power from RF generator 230 through impedance match network 232 to substrate holder 220. The RF bias can serve to heat electrons to form and maintain plasma. In this configuration, the system can operate as a reactive ion etch (RIE) reactor, where the chamber and upper gas injection electrode serve as ground surfaces. A typical frequency for the RF bias can range from 1 MHz to 100 MHz and is preferably 13.56 MHz.

Alternately, RF power can be applied to the substrate holder electrode at multiple frequencies. Furthermore, impedance match network 232 serves to maximize the transfer of RF power to plasma in processing chamber 210 by minimizing the reflected power. Various match network topologies (e.g., L-type, π-type, T-type, etc.) and automatic control methods can be utilized.

With continuing reference to FIG. 10, process gas can be, for example, introduced to processing region 212 from a gas injection system 241 coupled to a gas injection assembly 240. Process gas can, for example, include a mixture of gases such as argon, $CF_4$ and $O_2$, or argon, $C_4F_8$ and $O_2$ for oxide etch applications, or other chemistries such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$. Gas injection assembly 240 includes a showerhead, where process gas is supplied from a gas delivery system (not shown) to the processing region 212 through a gas injection plenum (not shown), a series of baffle plates (not shown) and a multi-orifice showerhead gas injection plate (not shown).

Vacuum pump system 258 can, for example, include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) is coupled to the process chamber 16. The pressure measuring device can be, for example, a Type 628B Baratron absolute capacitance manometer commercially available from MKS Instruments, Inc. (Andover, Mass.).

The process tool 210 may also include a light detection device 234 for monitoring the light emitted from the plasma in processing region 212 as shown in FIG. 10, or an electrical measurement device 236 for monitoring the electrical system of process tool 210 as shown in FIG. 10. The light detection device 234 can include a detector such as a (silicon) photo-diode or a photomultiplier tube (PMT) for measuring the total light intensity emitted from the plasma. The electrical measurement device 236 can include, for example, a current and/or voltage probe, a power meter, or spectrum analyzer. For example, plasma processing systems often employ RF power to form plasma, in which case, an RF transmission line, such as a coaxial cable or structure, is employed to couple RF energy to the plasma through an electrical coupling element (i.e., inductive coil, electrode, etc.). Electrical measurements using, for example, a current-voltage probe, can be exercised anywhere within the electrical (RF) circuit, such as within an RF transmission line. In alternate embodiments, electrical measurement device 236 can include a broadband RF antenna useful for measuring a radiated RF field external to material processing system 1.

Controller 255 includes a microprocessor, memory, and a digital I/O port (potentially including D/A and/or A/D converters) capable of generating control voltages sufficient to communicate and activate inputs to material processing system 201 as well as monitor outputs from material processing system 201. As shown in FIG. 10, controller 255 can be coupled to and exchange information with RF generator 230, impedance match network 232, gas injection system 241, vacuum pump system 258, backside gas delivery system 226, electrostatic clamping system 228, light detection device 234, and electrical measurement device 236. A program stored in the memory is utilized to interact with the aforementioned components of a material processing system 201 according to a stored process recipe. One example of controller 255 is a DELL PRECISION WORKSTATION 530™, available from Dell Corporation, Austin, Tex. Controller 255 can be locally located relative to the material processing system 201, or it can be remotely located relative to the material processing system 201. For example, controller 255 can exchange data with material processing system 201 using at least one of a direct connection, an intranet, and the internet. Controller 255 can be coupled to an intranet at, for example, a customer site (i.e., a device maker, etc.), or it can be coupled to an intranet at, for example, a vendor site (i.e., an equipment manufacturer). Additionally, for example, controller 255 can be coupled to the internet. Furthermore, another computer (i.e., controller, server, etc.) can, for example, access controller 255 to exchange data via at least one of a direct connection, an intranet, and the internet.

Figure 11:
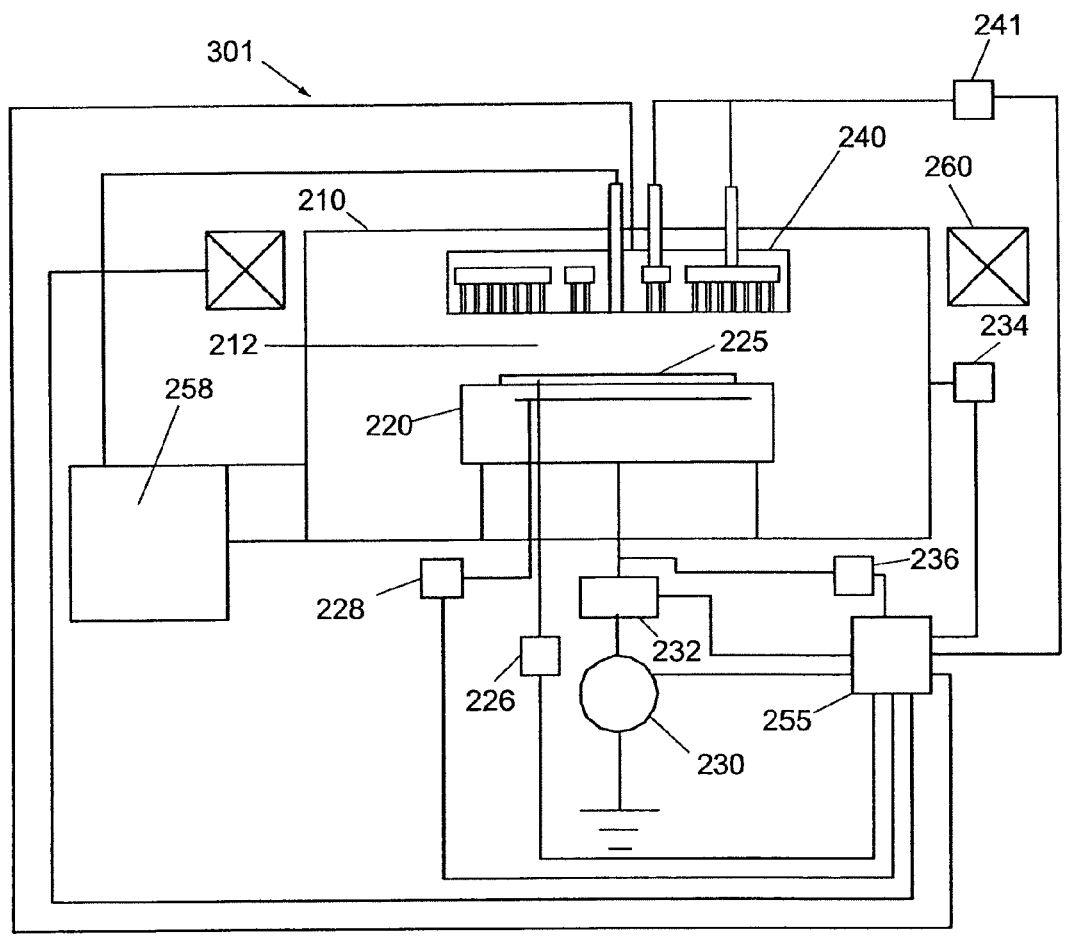
FIG. 11 is a schematic representation of a material processing system in accordance with another embodiment of the present invention.
Figure 12:
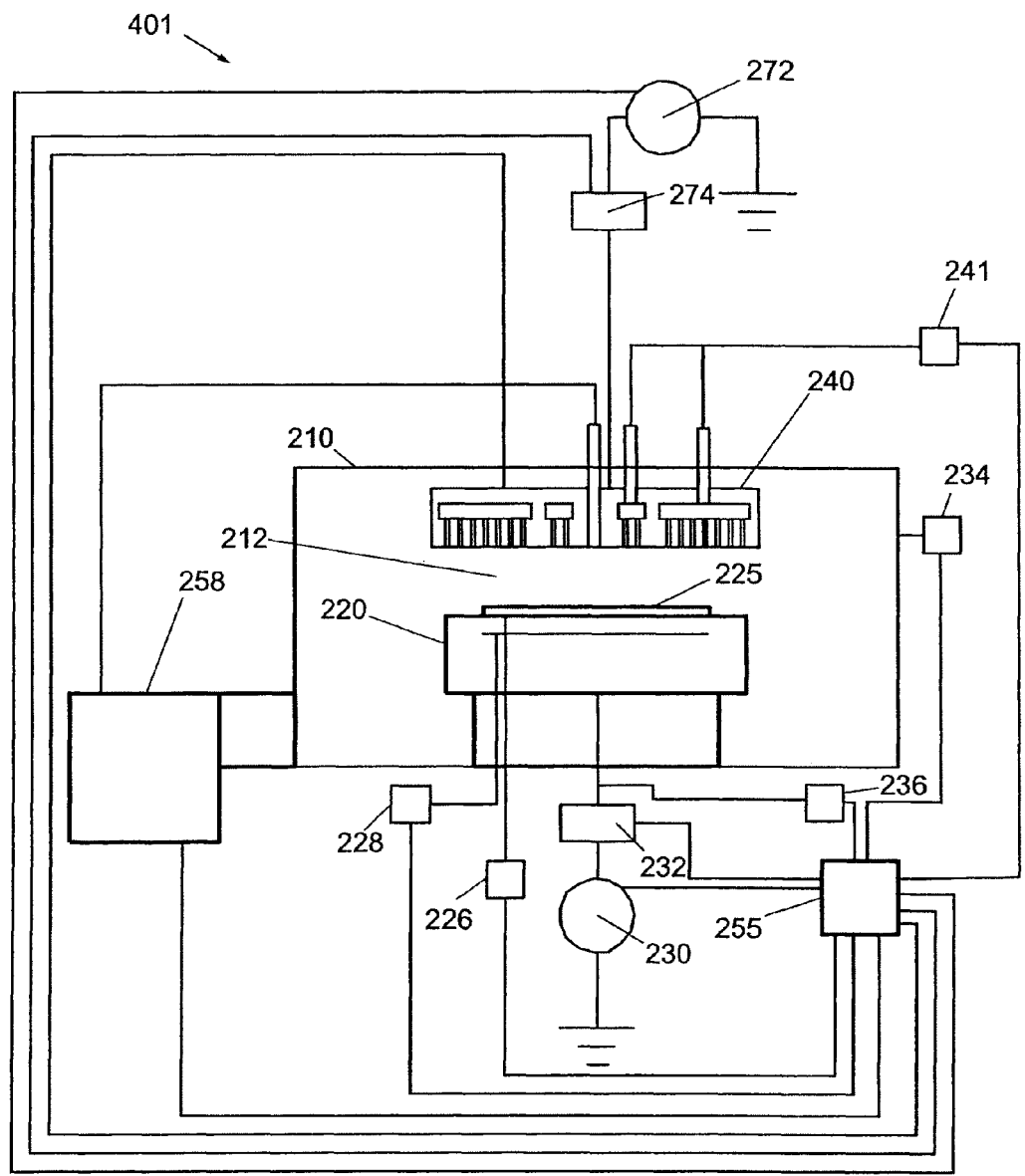
FIG. 12 is a schematic representation of a material processing system in accordance with yet another embodiment of the present invention.
Figure 13:
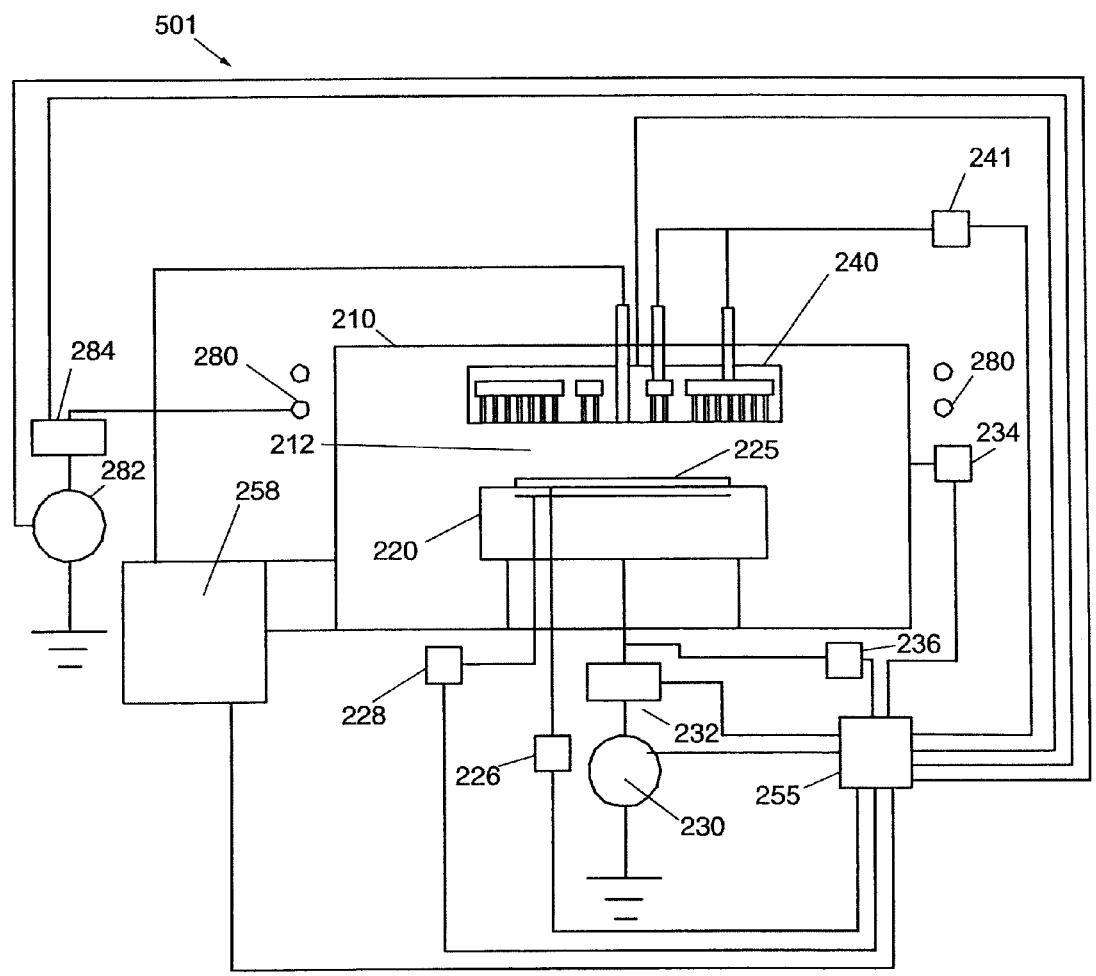
FIG. 13 is a schematic representation of a material processing system in accordance with still another embodiment of the present invention.

FIGS. 11-13 show alternative processing systems that can be used to implement the present invention. As shown in FIG. 11, material processing system 301 can include a magnetic field system 260. For example, the magnetic field system 260 can include a stationary, or either a mechanically or electrically rotating DC magnetic field in order to potentially increase plasma density and/or improve material processing uniformity. Moreover, controller 255 can be coupled to magnetic field system 260 in order to regulate the field strength or speed of rotation.

As shown in FIG. 12, the material processing system can include an upper electrode 270. For example, RF power can be coupled from RF generator 272 through impedance match network 274 to upper electrode 270. A frequency for the application of RF power to the upper electrode preferably ranges from 10 MHz to 200 MHz and is preferably 60 MHz. Additionally, a frequency for the application of power to the lower electrode can range from 0.1 MHz to 30 MHz and is preferably 2 MHz. Moreover, controller 255 can be coupled to RF generator 272 and impedance match network 274 in order to control the application of RF power to upper electrode 270.

As shown in FIG. 13, the material processing system of FIG. 10 can include an inductive coil 280. For example, RF power can be coupled from RF generator 282 through impedance match network 284 to inductive coil 280, and RF power can be inductively coupled from inductive coil 280 through dielectric window (not shown) to plasma processing region 212. A frequency for the application of RF power to the inductive coil 280 preferably ranges from 10 MHz to 100 MHz and is preferably 13.56 MHz. Similarly, a frequency for the application of power to the chuck electrode preferably ranges from 0.1 MHz to 30 MHz and is preferably 13.56 MHz. In addition, a slotted Faraday shield (not shown) can be employed to reduce capacitive coupling between the inductive coil 280 and plasma. Moreover, controller 255 can be coupled to RF generator 282 and impedance match network 284 in order to control the application of power to inductive coil 280. In an alternate embodiment, inductive coil 280 can be a "spiral" coil or "pancake" coil in communication with the plasma processing region 212 from above as in a transformer coupled plasma (TCP) reactor.

Alternately, the plasma can be formed using electron cyclotron resonance (ECR). In yet another embodiment, the plasma is formed from the launching of a Helicon wave. In yet another embodiment, the plasma is formed from a propagating surface wave. Obviously, numerous modifications and variations of the present invention are possible in light of the above teachings. For example, while the present invention is described in the context of providing substantially uniform pressure across the substrate surface, the inner and outer evacuation ports can be used to provide a non-uniform pressure in order to compensate for other process non-uniformities, for example. Additionally, the two evacuation zones can be used as a control parameter of process uniformity, in addition to gas distribution in the reaction zone 280, the flow of the gases in the processing region 280, as well as the RF voltage distribution along the electrodes, and by local plasma perturbations at the reactor boundaries. It is therefore to be understood that, within the scope of the appended claims, the invention can be practiced otherwise than as specifically described herein.

What is claimed is:

1. A method of controlling the pressure in a plasma processing chamber, comprising:
    evacuating chamber gases from a peripheral region of a processing region proximate to a substrate being processed in said plasma processing chamber;
    evacuating chamber gases substantially from a center of said processing region through an evacuation port in a gas injection assembly located above said substrate, the evacuation port having a baffle plate with at least two openings and being limited to a central region of the gas injection assembly; and
    controlling said evacuating the gases using at least one of a pump or a valve such that a first magnitude of a process parameter within said center of the processing region is adjusted relative to a second magnitude of the process parameter at the peripheral region of the processing region to provide more uniformity in the process parameter across the processing region.

2. The method of claim 1, further comprising:
    injecting a gas into the center of the processing region through a substantially central portion of the gas injection assembly;
    injecting a gas into the peripheral region of the processing region through a peripheral portion of the gas injection assembly; and
    independently controlling injection of process gas into the central region and the peripheral region to facilitate said adjusting of the process parameter within said center of the processing region the process parameter at the peripheral region of the processing region.

3. The method of claim 2, wherein said independently controlling comprises independently controlling at least two gas injection zones arranged concentrically around the center of the gas injection assembly.

4. The method of claim 1, wherein said evacuating chamber gasses from a center of the processing region comprises evacuating the chamber gases only through a single evacuation port located substantially in the center of the gas injection assembly.

5. The method of claim 4, wherein the entrant region has a diameter between 1 cm and 15 cm.

6. The method of claim 1, wherein said evacuating chamber gasses from a center of the processing region comprises evacuating the chamber gases through multiple openings provided substantially in the center of the gas injection assembly.

7. The method of claim 6, further comprising providing said multiple openings in the center of the gas injection assembly by attaching a removable baffle plate substantially to a center of the gas injection assembly.

8. The method of claim 7, wherein the removable baffle plate is mounted on a lower surface of the gas injection assembly.

9. The method of claim 8 further comprising threading the removable baffle plate threaded to screw into a threaded recess in the gas injection assembly.

10. The method of claim 1, further comprising generating a plasma within said processing chamber, and impeding the plasma from passing through the evacuation port.

11. The method of claim 10, wherein said impeding comprises providing a plurality of openings coupled to said evacuation port, each and openings having a high aspect ratio sufficient to impede plasma from passing though the opening.

12. The method of claim 11, wherein an aspect ratio (ratio of length to diameter) of each of the openings in the gas injection assembly evacuation port located within the removable baffle plate ranges from 1 to 200.

13. The method of claim 1, further comprising using a turbomolecular pump to maintain vacuum pressure in the chamber at less than 50 mTorr.

14. The method of claim 1, wherein said evacuating further comprises evacuating through at least two openings arranged substantially concentrically around a center in the central region of the gas injection assembly.

15. The method of claim 1, wherein said evacuating from a peripheral region comprises evacuating through a sidewall port coupled to said processing chamber.

* * * * *